United States Patent
Molitor et al.

(10) Patent No.: US 9,736,967 B2
(45) Date of Patent: Aug. 15, 2017

(54) COOLING APPARATUS FOR AN ELECTRICAL OR ELECTRONIC DEVICE, AND ELECTRICAL OR ELECTRONIC DEVICE, IN PARTICULAR A CIRCUIT BREAKER, COMPRISING SUCH COOLING APPARATUS

(71) Applicant: ABB S.p.A, Milan (IT)

(72) Inventors: Francoise Molitor, Zurich (CH); Patrik Kaufmann, Baden (CH); Tilo Buehler, Othmarsingen (CH); Francesco Agostini, Zofingen (CH); Thomas Gradinger, Aarau Rohr (CH); Federico Gamba, Bergamo (IT)

(73) Assignee: ABB S.P.A., Milan (IT)

( * ) Notice: Subject to any disclaimer, the term of this patent is extended or adjusted under 35 U.S.C. 154(b) by 0 days.

(21) Appl. No.: 14/906,313

(22) PCT Filed: Aug. 7, 2013

(86) PCT No.: PCT/EP2013/066549
§ 371 (c)(1),
(2) Date: Jan. 20, 2016

(87) PCT Pub. No.: WO2015/018443
PCT Pub. Date: Feb. 12, 2015

(65) Prior Publication Data
US 2016/0174414 A1   Jun. 16, 2016

(51) Int. Cl.
*H05K 7/20* (2006.01)
*H01H 9/52* (2006.01)
(Continued)

(52) U.S. Cl.
CPC ........... *H05K 7/20218* (2013.01); *H01H 9/52* (2013.01); *H02B 1/56* (2013.01); *H05K 7/20336* (2013.01)

(58) Field of Classification Search
CPC . G06F 1/181–1/182; H05K 7/20218–7/20381;
(Continued)

(56) References Cited

U.S. PATENT DOCUMENTS 4,809,058 A * 2/1989 Funamoto ............. H01L 23/473
                                                  257/697
5,565,716 A * 10/1996 Tierney, Jr. ............ G01R 1/203
                                                  307/149
(Continued)

FOREIGN PATENT DOCUMENTS

| DE | 202006013674 U1 | 11/2006 |
| EP | 2256772 A1 | 12/2010 |
| EP | 2552182 A1 | 1/2013 |

OTHER PUBLICATIONS

International Search Report & Written Opinon in PCT/EP2013/066549 dated May 27, 2014.

*Primary Examiner* — Anthony Haughton
*Assistant Examiner* — Razmeen Gafur
(74) *Attorney, Agent, or Firm* — Manelli Selter PLLC; Edward J. Stemberger

(57) ABSTRACT

Cooling apparatus cooling for an electrical or electronic device, comprising an at least partially hollow body containing a refrigerant and having a plurality of electrically conductive sections Each electrically conductive section has a respective coupling portion suitable to be operatively associated with a corresponding electrically conductive part of the electrical or electronic device, wherein the at least partially hollow body further comprises one or more electrically insulating sections. Each electrically insulating section is positioned between and electrically insulates from each other two adjacent electrically conductive sections.

17 Claims, 9 Drawing Sheets

(51) Int. Cl.
*H02B 1/56* (2006.01)
*H01L 23/473* (2006.01)

(58) Field of Classification Search
CPC .............. H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 5,977,479 | A * | 11/1999 | Tokuda | H01L 23/34 165/185 |
| 6,053,238 | A * | 4/2000 | Goth | F28D 1/0477 165/10 |
| 7,312,987 | B1 * | 12/2007 | Konshak | G06F 1/20 165/80.4 |
| 7,319,589 | B1 * | 1/2008 | Heady | H05K 7/2099 165/104.33 |
| 7,864,532 | B1 * | 1/2011 | Ehret | H01Q 13/0283 165/104.26 |
| 2005/0052847 | A1 * | 3/2005 | Hamman | F28D 1/0535 361/699 |
| 2005/0063158 | A1 * | 3/2005 | Thiele | F28D 15/0266 361/700 |
| 2005/0180105 | A1 * | 8/2005 | Matsushima | G06F 1/20 361/699 |
| 2006/0011326 | A1 * | 1/2006 | Yuval | F28D 1/0475 165/80.4 |
| 2007/0133172 | A1 * | 6/2007 | Cheon | G06F 1/20 361/699 |
| 2007/0159797 | A1 * | 7/2007 | Teneketges | H01L 23/473 361/699 |
| 2011/0317365 | A1 * | 12/2011 | Tang | H05K 7/20772 361/699 |
| 2011/0317367 | A1 * | 12/2011 | Campbell | H05K 7/20809 361/700 |
| 2012/0026692 | A1 * | 2/2012 | Loong | H01L 21/4878 361/702 |
| 2012/0300398 | A1 * | 11/2012 | Eckberg | H05K 7/2079 361/692 |
| 2013/0077245 | A1 * | 3/2013 | Gradinger | F28D 1/035 361/700 |
| 2014/0071629 | A1 * | 3/2014 | Habert | H01L 23/427 361/701 |
| 2014/0218865 | A1 * | 8/2014 | Wagner | G06Q 10/087 361/702 |
| 2015/0003015 | A1 * | 1/2015 | Kulkarni | H05K 7/1432 361/700 |
| 2015/0077936 | A1 * | 3/2015 | Ionescu | H05K 7/20927 361/699 |
| 2015/0124381 | A1 * | 5/2015 | Wu | H02B 1/56 361/678 |
| 2015/0234438 | A1 * | 8/2015 | Druzhinin | H05K 7/20254 361/679.53 |
| 2015/0282291 | A1 * | 10/2015 | Singh | H05K 1/021 361/689 |

* cited by examiner

COOLING APPARATUS FOR AN ELECTRICAL OR ELECTRONIC DEVICE, AND ELECTRICAL OR ELECTRONIC DEVICE, IN PARTICULAR A CIRCUIT BREAKER, COMPRISING SUCH COOLING APPARATUS

The present disclosure relates to a cooling apparatus for an electrical or electronic device, and to an electrical or electronic device, in particular a circuit breaker, comprising such a cooling apparatus.

The cooling apparatus according to the present disclosure is particularly suitable for applications with circuit breakers and will be described hereinafter by making particular reference to such application without intending in any way its possible fields of application.

It is well known in the art the use of cooling solutions in the field of electrical/electronic applications.

In fact, during operations, electrical/electronic devices are subject to heating and must be cooled in order to avoid excessive temperatures which may result in deteriorating the performances and reliability of the device if not even to complete failures.

For instance, it is known the use of circuit breakers which are for example installed into switchboards and whose input and output terminals are connected to an associated power distribution line through one or more conductive components or parts.

Considering the assembly of the circuit breaker and of the parts or components associated therewith, it is possible to schematize each of the circuit breaker poles or branches as an electrical chain constituted by elements placed in series with each other. In such electrical chain, each element contributes to an increase in the electrical resistance (or analogously to a deterioration of the overall conductivity) and thus constitutes a potential source of heat due to Joule effect.

The undesired heat is generated both in the various conducting sections (for example made of copper) and, above all, at each of the present electrical couplings. The various junctions introduce other micro-discontinuities where significant localized increases of electrical resistance can be found.

Clearly, the heat that is generated due to these dispersions contributes to a temperature increase; but, since the temperature of the circuit breaker and the temperature of the switchboard inside which it is installed should be maintained within predefined operating limits, any undesired increase of electrical resistance in the conductive paths compels limiting the power that can be drawn by a device and can negatively influence the operation of the circuit breaker itself.

In particular, the fraction of the actually usable maximum load (compared to the theoretical nominal capacity) is generally expressed in the form of "de-rating" coefficients that are based on the overall effective conditions of installation; in addition to the constraints associated with de-rating, it is therefore desirable to maintain the operating temperature of the circuit breaker at low levels; it is well known in fact that the higher is the operating temperature, the lower is the life span of the circuit breaker (or of its more sensitive components).

In general this issue has been faced according to various cooling solutions and depending on the various applications.

For instance there have been used air cooling systems with or without forced convection. More recent solutions have been designed as heat pipe or thermosyphon cooling systems; examples of such solutions are described in patent documents EP2552182, and EP2256772. Although these known solutions certainly provided some improvements, there is still room and need for further improvements.

Therefore, the main object of this disclosure is to provide a solution that further improves the cooling of an associated electrical or electronic device, and in particular of a circuit breaker, as well as of the electrical switchboard inside which the circuit breaker or electrical/electronic device can be used.

This object is achieved by way of a cooling apparatus cooling for an electrical or electronic device, characterized in that it comprises an at least partially hollow body containing a refrigerant and having a plurality of electrically conductive sections, each of said plurality of electrically conductive sections having a respective coupling portion suitable to be operatively associated with a corresponding electrically conductive part of said electrical or electronic device, wherein said at least partially hollow body further comprises one or more electrically insulating sections, each of said one or more electrically insulating sections being positioned between and electrically insulating from each other two adjacent electrically conductive sections of said plurality of electrically conductive sections.

In particular, and as it will become apparent from the following description, the cooling apparatus according to the present disclosure allows efficient cooling of multiple heat sources at different electrical potentials with a single thermosyphon cooling system, while maintaining the electrical insulation between the different potentials.

Further characteristics and advantages will become more apparent from the description of some preferred but not exclusive embodiments of the device according to the disclosure, illustrated only by way of non-limiting examples with the aid of the accompanying drawings, wherein.

Figure 1:
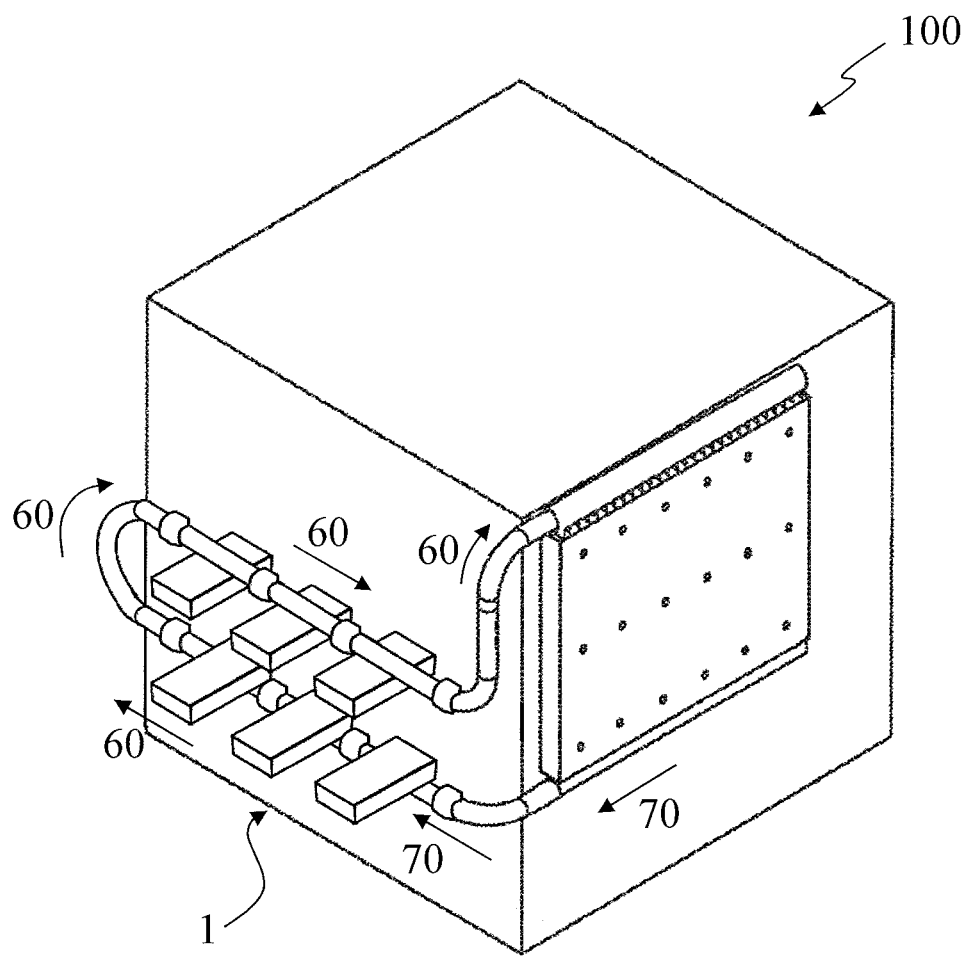
FIG. 1 is a perspective view schematically illustrating an exemplary cooling apparatus according to the present disclosure coupled with an associated electrical/electronic device.
Figure 8:
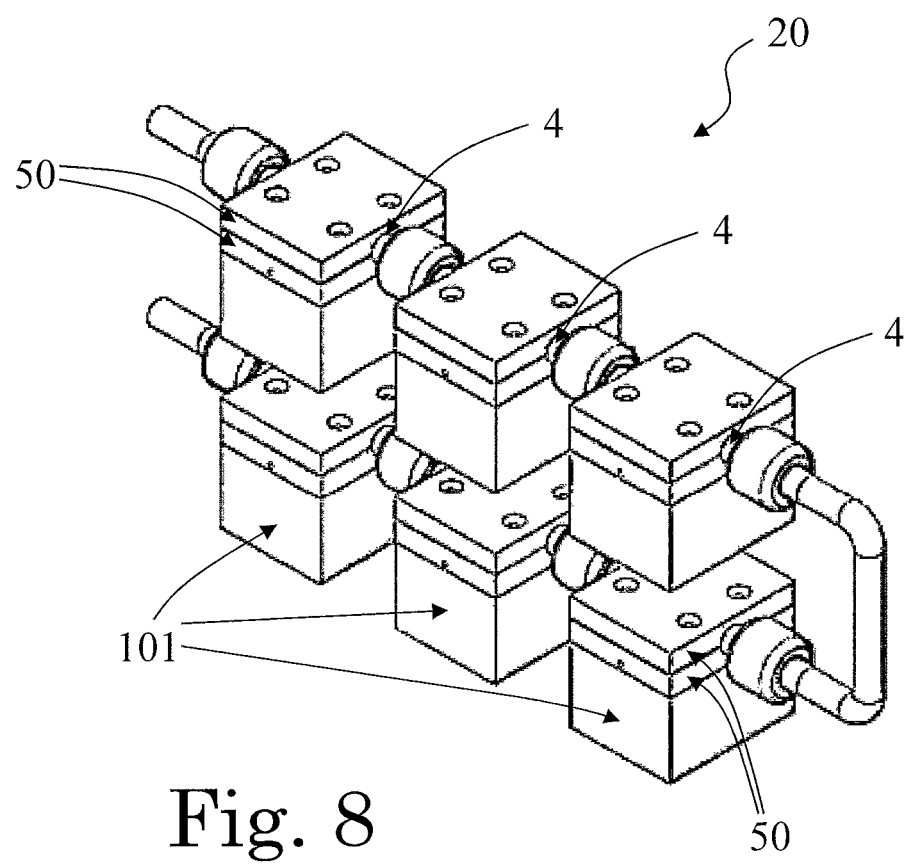
Figure 6:
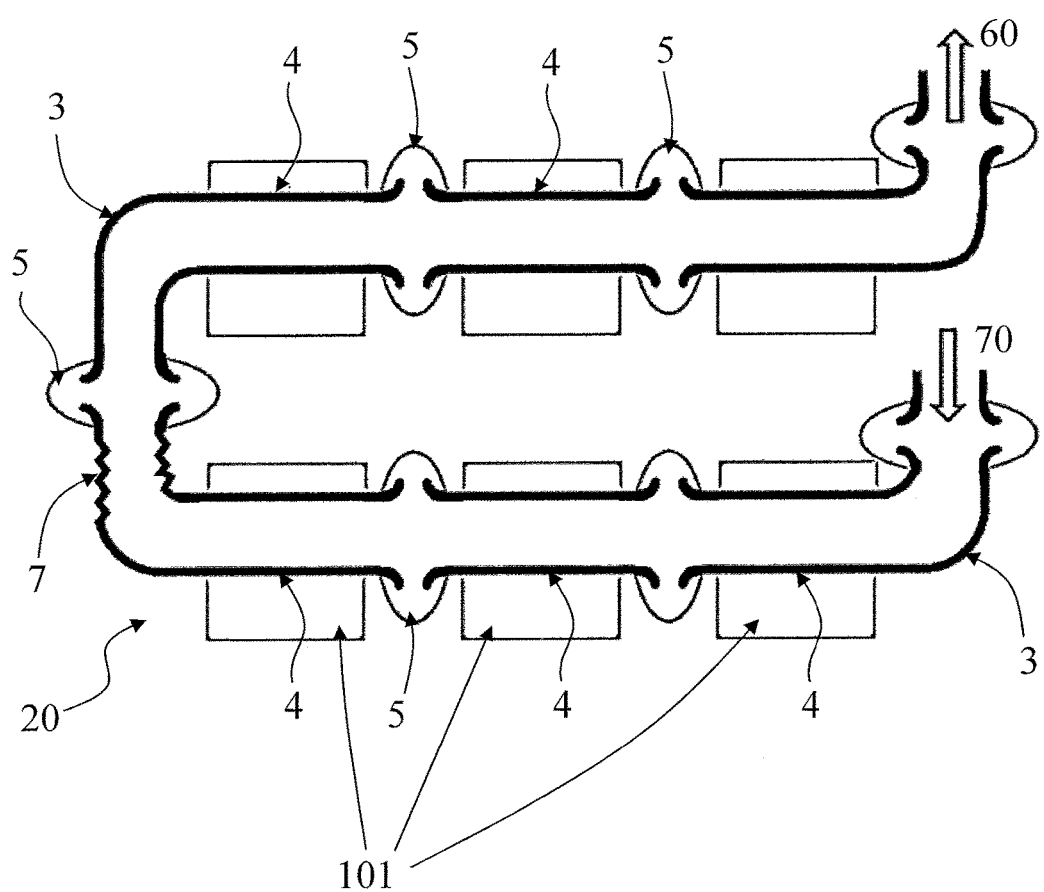
Figure 7:
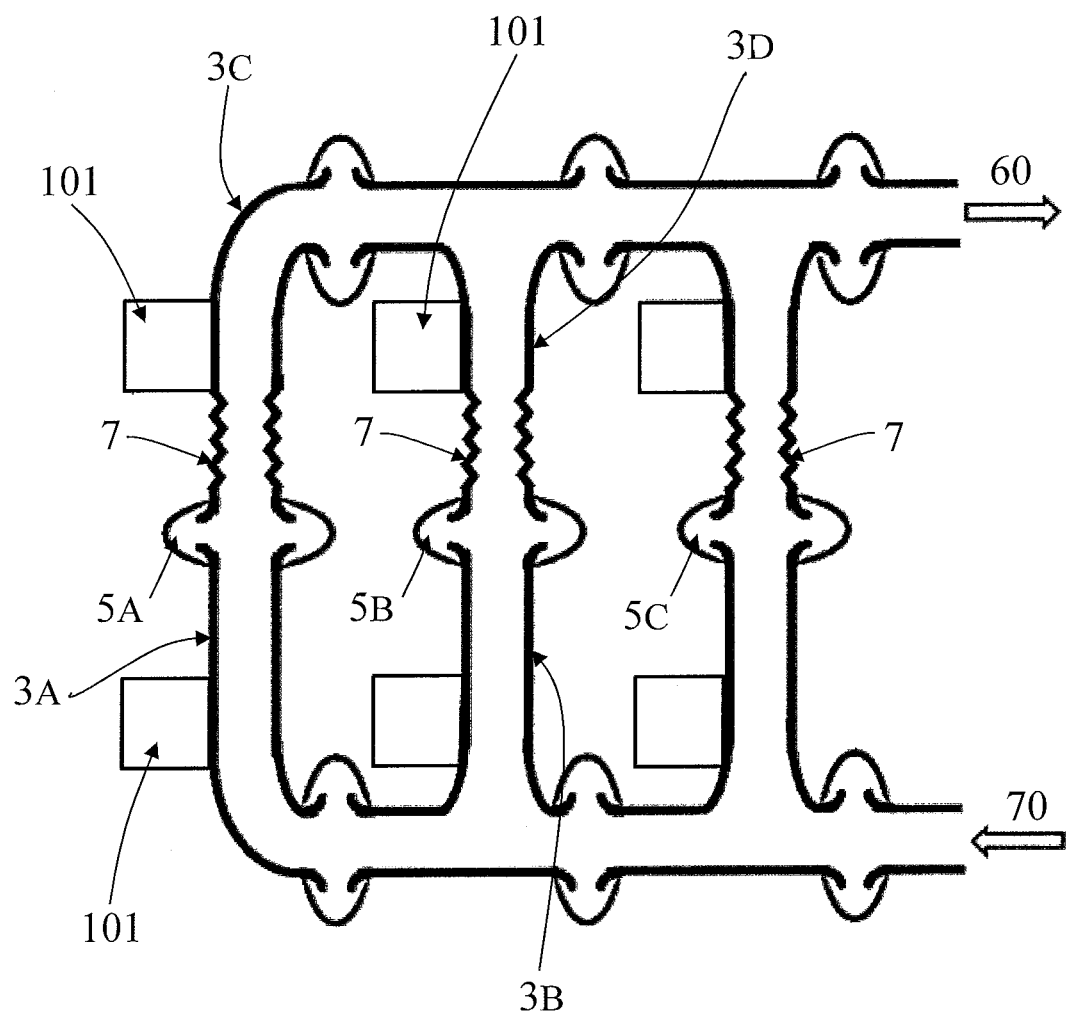
Figure 9:
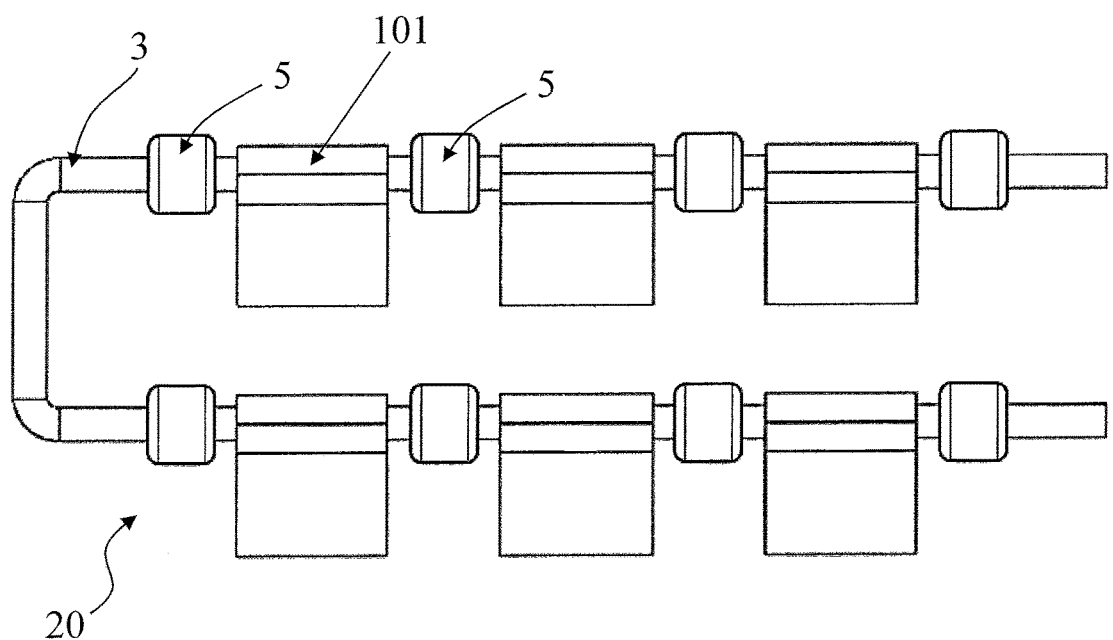
Figure 10:
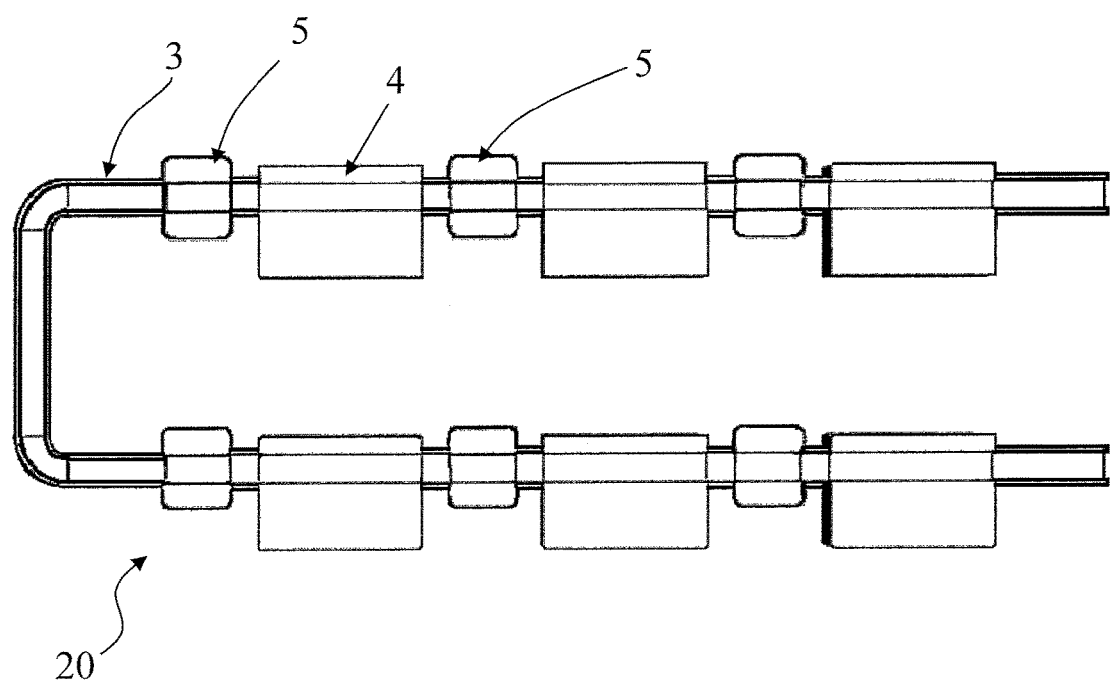
Figure 11:
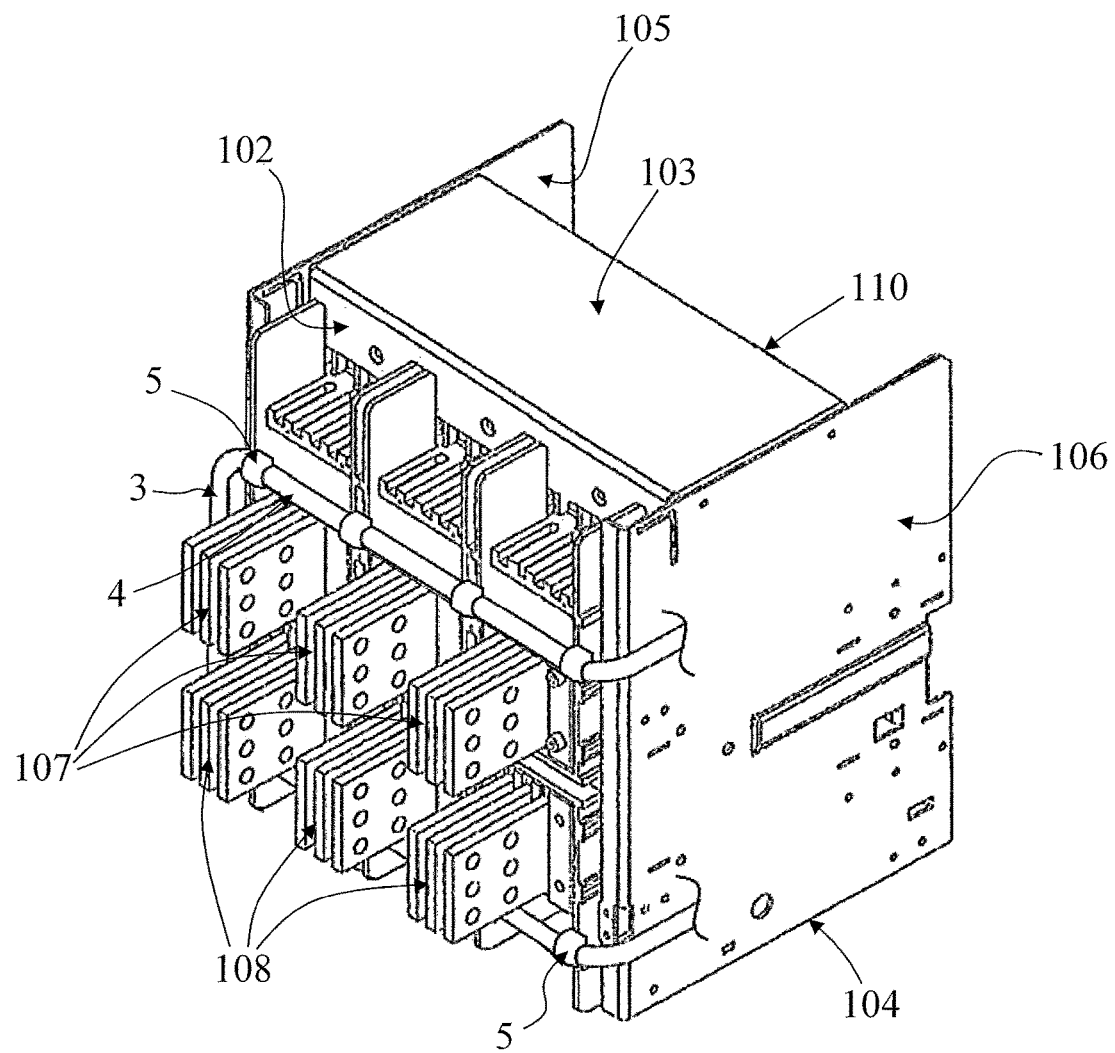
Figure 12:
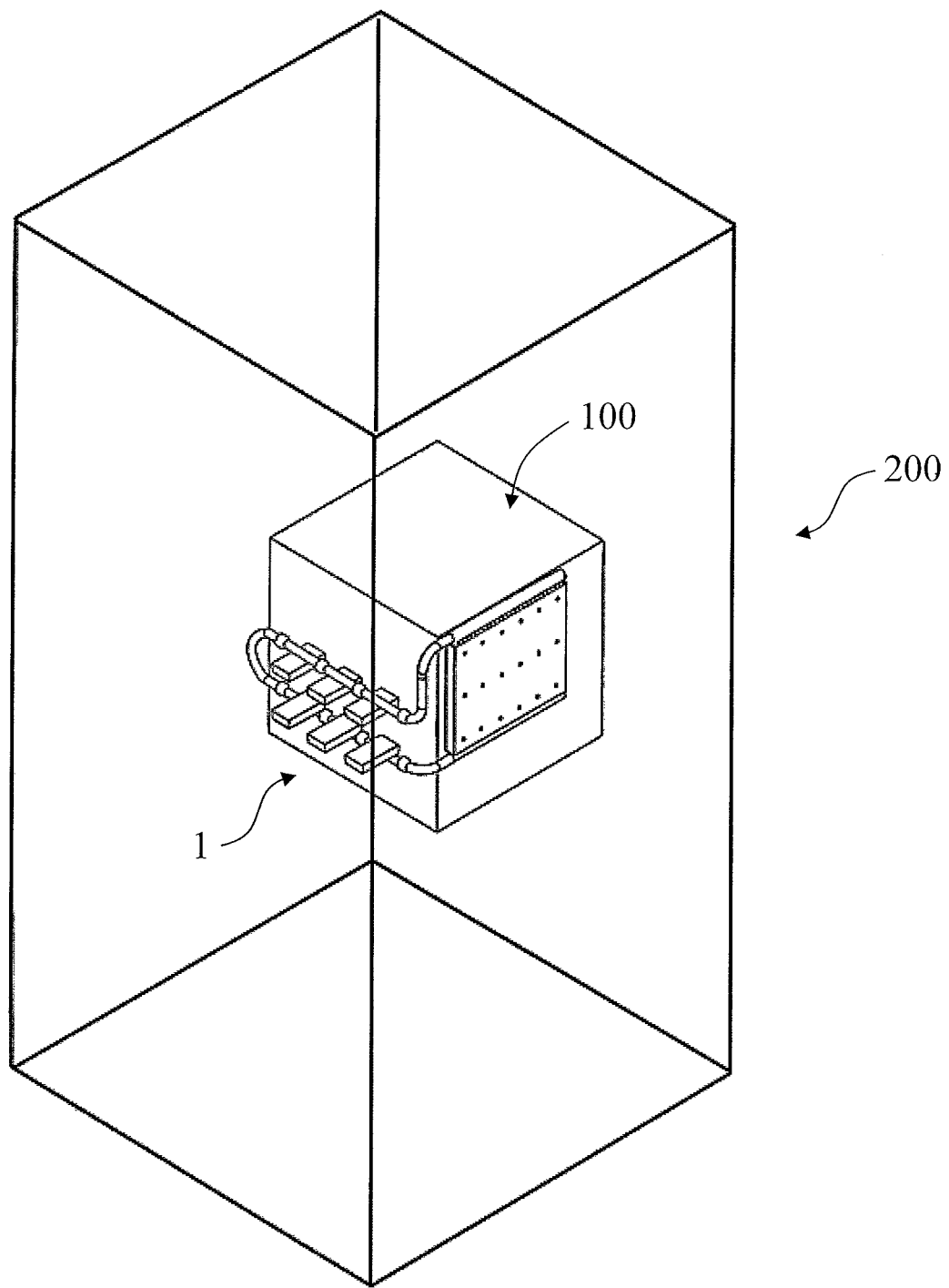

FIGS. 6 and 7 schematically show two exemplary layouts of a part of a cooling apparatus according to the present disclosure;

FIG. 8 is a perspective view showing an exemplary embodiment of part of a cooling apparatus according to the present disclosure in line with the schematic layout illustrated in FIG. 6;

FIG. 9 is a plan view of FIG. 8;

FIG. 10 is a plan, cross-section view schematically showing another exemplary embodiment of part of a cooling apparatus according to the present disclosure in line with the schematic layout illustrated in FIG. 6;

FIG. 11 is a perspective view representing a circuit breaker under coupling with a cooling apparatus according to the present disclosure;

FIG. 12 is a schematic perspective view representing a switchboard housing an electrical breaker provided with a cooling apparatus as for example illustrated in FIG. 1.

It should be noted that in the detailed description that follows, identical or similar components, either from a structural and/or functional point of view, have the same reference numerals, regardless of whether they are shown in different embodiments of the present disclosure; it should also be noted that in order to clearly and concisely describe the present disclosure, the drawings may not necessarily be to scale and certain features of the disclosure may be shown in somewhat schematic form.

Further, when the term "adapted" or "arranged" or "configured" or "shaped", is used herein while referring to any component as a whole, or to any part of a component, or to a whole combinations of components, or even to any part of a combination of components, it has to be understood that it means and encompasses correspondingly either the structure, and/or configuration and/or form and/or positioning of the related component or part thereof, or combinations of components or part thereof, such term refers to.

FIG. 1 schematically represents an electrical or electronic device 100 operatively coupled with a cooling apparatus 1 (hereinafter referred to as the "apparatus 1") according to the present disclosure.

In particular, the apparatus 1 according to the present disclosure comprises a body which is at least partially hollow; the at least partially hollow body contains a refrigerant 2 and has a plurality of electrically conductive sections 3, namely two or more, which are also thermally conductive. Each electrically conductive section 3 of this plurality of electrically conductive sections has a respective coupling portion 4 suitable to be operatively associated, and in particular in thermal contact, with a corresponding electrically conductive part 101 of the electrical or electronic device 100.

Further, the at least partially hollow body comprises one or more electrically insulating sections 5, each of which is positioned between and electrically insulates from each other two adjacent electrically conductive sections 3 of the plurality of electrically conductive sections. Clearly between two adjacent electrically conductive sections 3 there could be more than one electrically insulating section 5.

In practice, the interposed one or more electrically insulating sections 5 while giving structural continuity to the cooling apparatus as a whole, provide at the same time electrical insulation between electrically conductive parts.

In the exemplary embodiments illustrated, the electrically conductive sections 3 are preferably made of a material selected from the group consisting of aluminum, copper, steel or alloys containing these materials as for example brass.

According to a first embodiment, the one or more electrically insulating sections 5 are made of polymer resin, e.g. an epoxy resin for instance of HCEP (Hydrophobic Cycloaliphatic Epoxy) type, such as those based on main components Araldit® and Aradur®.

Figure 3:
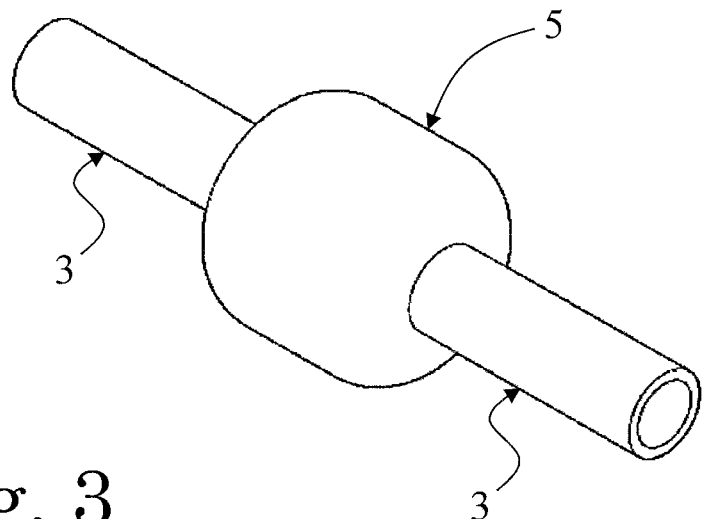
FIGS. 3 and 4 are perspective views schematically illustrating an exemplary part of a cooling apparatus according to the present disclosure.
Figure 5:
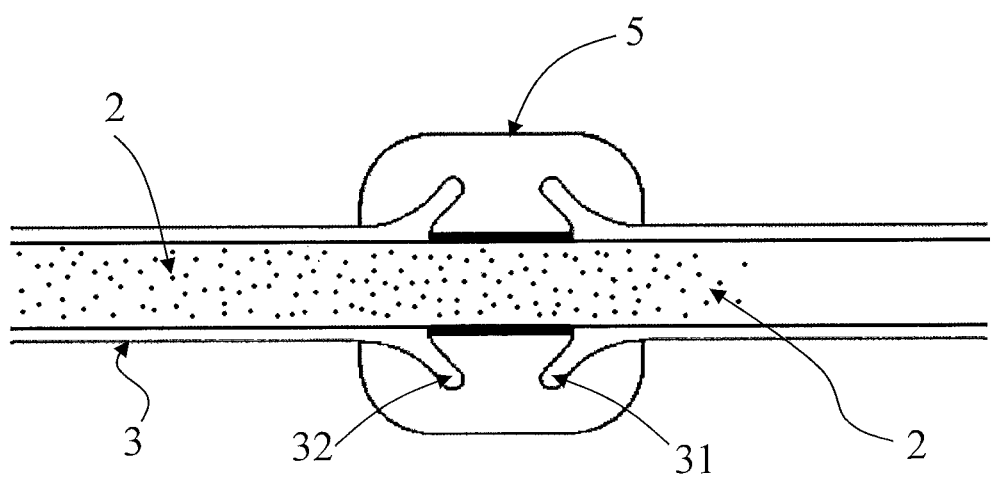
FIG. 5 is a cross-section showing an exemplary embodiment of the part illustrated in FIG. 3.

In particular according to this embodiment, and as for instance illustrated in FIGS. 3 and 5, the one or more electrically insulating sections 5 made of epoxy resin are molded over and between corresponding ends of two adjacent electrically conductive sections 3.

Figure 4:
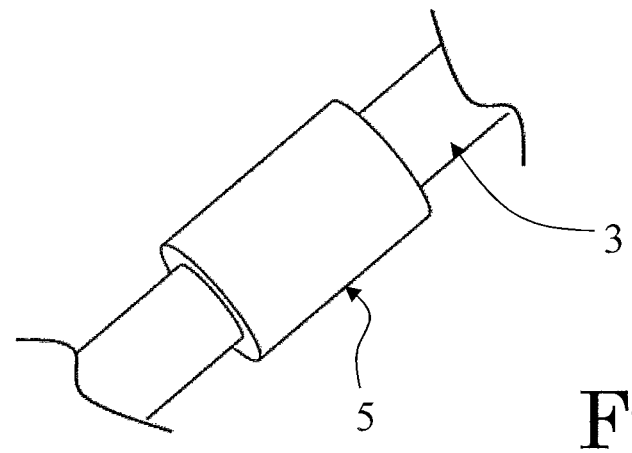

According to a second embodiment, as illustrated for example in FIG. 4, each electrically insulating section 5 is made of ceramic material, such as an alumina-based material. In this embodiment, for example each insulating section takes the form of a ceramic insulator on which the corresponding ends of the associated two adjacent electrically conductive sections 3 are connected, e.g. brazed.

A suitable ceramic insulator which can be used in the apparatus 1 is for instance that commercialized under the trademark ALUCER®.

In turn, the refrigerant 2 is a dielectric refrigerant fluid; non limiting examples of suitable working fluids are refrigerants such hydrofluorocarbons, e.g. R245fa, R134a, R1234ze, R1234yf, or fluorinated liquids, etc.

However, any suitable material available on the market can be used for the electrically conductive sections 3, the electrically insulating sections 5, and the refrigerant 2; in addition, it is possible even to use combinations or mixtures of different materials.

According to the applications and in particular on the number of coupling parts 101 of the associated electrical or electronic device 100, the apparatus 1 can have any suitable number of electrically conductive sections 3 with their respective coupling parts 4, and correspondingly suitable number of electrically insulating sections 5.

For instance, FIGS. 3 and 4 show basic examples where there are depicted (partially) two conductive sections 3 and an electrically insulating section 5 which is interposed between and electrically insulates from each other the two electrically conductive sections 3.

Further, the apparatus 1 can be shaped according to different layouts so as to be suitable for different applications.

For example, FIG. 6 schematically shows a portion of the apparatus 1 where the at least partially hollow body has at least a part 20 arranged, e.g. in a U-shaped configuration, with the plurality of thermally conductive sections 3 and the one or more electrically insulating sections 5 which are positioned in series, e. g. in alternate sequence, to each other.

This layout can be used for instance when the conductive parts 101 of the electrical or electronic device 100 are positioned horizontally.

FIG. 7 shows another exemplary layout wherein the hollow body has at least a part arranged so as at least two electrically conductive sections 3 of the plurality of electrically conductive sections 3, e.g. sections 3A-3B and sections 3C-3D are positioned in parallel to each other.

In this exemplary embodiment, some electrically conductive sections 3 are also in series to each other; for instance, electrically conductive section 3A, electrically insulating section 5A, and electrically conductive section 3C, are placed in series to each other, as well as electrically conductive section 3B, electrically insulating section 5B, and electrically conductive section 3D are placed in series to each other.

In addition, in order to better mechanically adapt to the associated electrical device, and in any of the illustrated embodiments, the at least partially hollow body can comprise one or more flexible portions, for example metallic bellows, schematically indicated by the reference number 7 only in FIGS. 6 and 7.

FIGS. 1-2 and 8-10 show some exemplary constructive embodiments of parts of the cooling apparatus 1 according to the present disclosure.

In particular, as illustrated therein, the at least partially hollow body comprises: a conduit-shaped part 20, e.g. U-shaped, which can be realized modularly, e.g. by means of a plurality of separate parts assembled together, or in a single piece, and along which there are placed the electrically conductive sections 3 with their coupling portions 4, and the electrically insulating sections 5; and a condenser part 21 which can comprise or consist of a heat exchanger cooled for example by a second thermosyphon or water cooled, or a (natural or forced) air convection cooler, which is connected at the ends of the conduit-shaped part 20.

Figure 2:
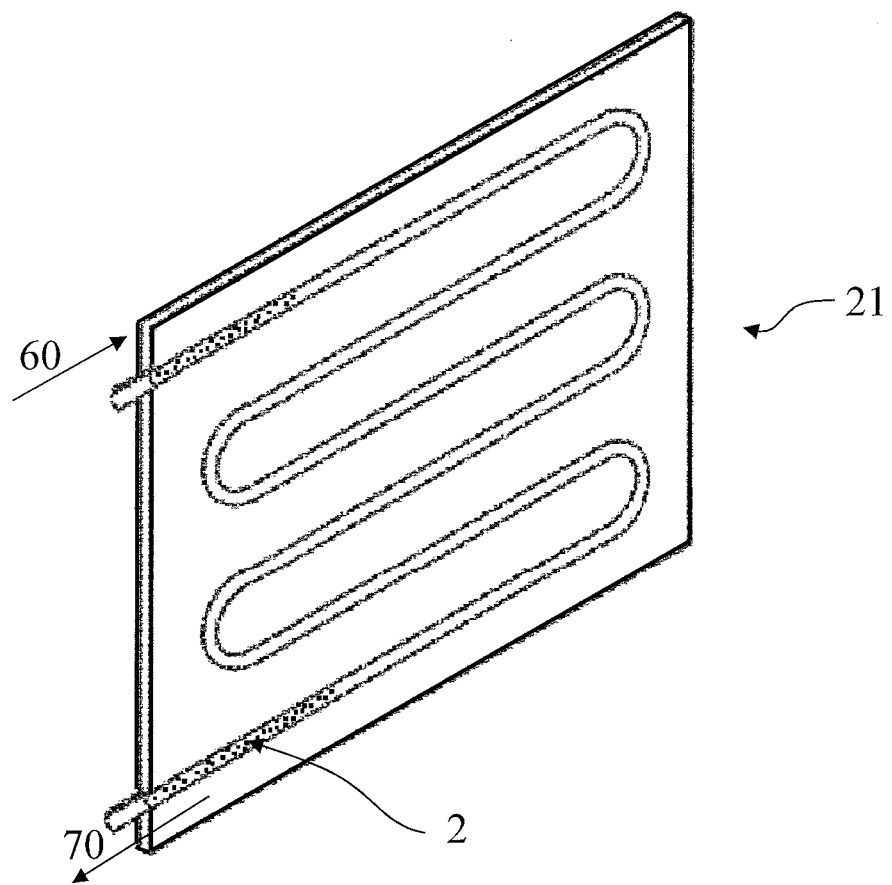
FIG. 2 is a cross-section showing schematically an exemplary embodiment of a portion of the cooling apparatus of FIG. 1.

As illustrated in FIG. 2, also the heat exchanger part 21 is arranged so as to have an internal cavity which is suitable to form together with the cavity defined by the conduit-shaped part 20 a continuous closed circuit for the refrigerant 2.

According to the embodiments illustrated in FIGS. 8-10, the electrically conductive sections 3 are each tubular-shaped, e.g. as shown also in FIG. 5, and the one or more electrically insulating sections 5 are made of polymer resin, as for example epoxy with or without filler directly molded over and between corresponding ends 31, 32 of two adjacent electrically conductive sections 3.

Clearly, when epoxy resin is used in order to realize the electrically insulating section 3, it can be molded over the corresponding parts of the electrically conductive sections 3 also when these sections have a shape other than a tubular one.

Preferably, as illustrated in FIG. 5, each of the tubular-shaped electrically conductive sections 3 has at least one end portion 31, 32 having an enlarged cross-section with respect to the section of the remaining part of the tubular body itself, and which enlarged end part is embedded into the molded epoxy resin so as to improve the dielectric insulation capacity.

In practice, when the apparatus 1 is coupled with an associated electrical device 100, the conduit-shaped part 20 is positioned so as to have the various electrical conductive sections 3, and in particular the coupling parts 4, operatively associated each with a corresponding conductive part 101 to be cooled, i.e. there is established a thermal exchange between them.

For instance, the tube-shaped parts forming the coupling portions 4 can be put directly in contact with the corresponding conductive parts 101; or, according to the embodiment of FIGS. 8-9, the coupling portions 4 of the electrically conductive sections 3 may comprise additional thermally and electrically conductive shells 50 clamping the tubular coupling portion and connected on top of the respective conductive part 101.

Alternatively, as shown in the embodiment of FIG. 10, the coupling portions 4 can be realized by means of blocks or terminals 51 provided each with a borehole 52 and assembled, e.g. through threaded coupling, or soldering, etc. with the other components forming the conduit-shaped part 20, with each borehole 52 contributing to form the whole circuit for the refrigerant 2.

In this case, the blocks 51 resemble and can constitute the terminals of an associated circuit breaker to which the cooling apparatus 1 has to be connected to.

In practice, when the electrical or electronic device is operating and dissipates heat, the heat is transferred from the corresponding conductive parts 101 to the thermally and electrically conductive sections 3 which they are associated with and act as evaporators for the refrigerant 2. Heat is collected by means of the evaporating refrigerant, and flows towards the heat exchanger part 21 following the path indicated by arrows 60. In this way a certain quantity of heat is transferred to the heat exchanger part 21 which in turn releases the heat outside the cooling apparatus 1, e.g. in the external environment or towards a further cooling system or apparatus. The heat exchanger or cooler part 21 acts as a condenser for the refrigerant 2 which returns for example mostly in a liquid state and flows towards the evaporator part 20 following the path indicated by arrows 70.

The thermosyphon can also have a non-looped shaped arrangement, meaning that the vapor traveling from the evaporator sections to the condenser section and the liquid returning from the condenser section towards the evaporator sections flow through the same tubing.

In this configuration, in order to better ensure that the condensed liquid is properly routed towards the evaporators represented by the coupling portions 4, it is possible to adopt a nested configuration for the conduit-shaped part 20, namely one tubular part containing and conveying the liquid can be at least partially entered into a larger tubular part where the vapor flows.

It has been observed in practice how the cooling apparatus 1 according to the present disclosure allows accomplishing the intended scope by providing some significant improvements with regard to known solutions; in fact, the cooling apparatus 1 allows to remove a substantial quantity of heat from the associated electric/electronic device, and to dissipate it to ambient.

It should be noted that the apparatus 1 has a simple structure and can be sold as a kit to be applied in principle to any type of suitable electrical or electronic device, and especially with electric/electronic devices having heat sources at different electrical potential; hence, the present disclosure also encompasses an electrical or electronic device 100 comprising a cooling apparatus 1 as previously described and in particular defined in the appended claims.

As previously mentioned, the cooling apparatus 1 is particularly suitable to be used in connection with an electric device, and in particular a circuit breaker, where the conductive portions 101, e.g. in case of a low voltage circuit breaker its input/output terminals, are on electric potential and have to be insulated electrically from each other.

An exemplary circuit breaker 100 is illustrated in FIG. 11 and comprises a case having a front wall 110, a rear wall 102, an upper wall 103, a lower wall 104, two flanks 105, 106 and a first series of side-by-side terminals 107 and a second series of side-by-side terminals 108 that protrude outside from the case for the connection of the circuit breaker 100 with an electrical circuit.

Hence, the present disclosure also encompasses a circuit breaker 100 comprising a first series of side-by-side terminals and a second series of side-by-side terminals for connection of the circuit breaker with an electrical circuit, characterized in that it comprises at least one cooling apparatus 1 according to what described and in particular defined in the appended claims.

In particular, as illustrated in FIG. 11 each terminal of the first and second series of side-by-side terminals 107, 108 is operatively coupled to, e.g. in thermal contact with, a corresponding coupling part 4 of the cooling apparatus 1.

As known, a circuit breaker in particular for low voltage applications can be realized according to different configurations, e.g. in a fixed execution, or in a withdrawal or removable (plug-in) execution, wherein the part containing the breaking components is couplable to an adapter in a separable manner. In these cases the cooling apparatus 1 can be coupled to terminals provided on the adapter part.

In addition, the cooling apparatus 1 according to the present disclosure can be used together with a circuit breaker or any other electrical or electronic device 100 for application in any type of electrical switchboard, e.g. in retrofitting operations, or can be installed inside a switchboard by simply associating it with an already existing device, e.g. for connecting it to an associated electric line. Therefore, another object of the present invention is represented by an electrical switchboard 200, illustrated for example in FIG. 12, having a plurality of walls 201 that define an internal volume intended to house one or more electrical or electronic devices, characterized in that it comprises a cooling apparatus 1 according to what was previously described and defined in the appended claims.

The cooling apparatus 1 thus conceived is susceptible of modifications and variations, all of which are within the scope of the inventive concept as defined in particular by the appended claims; any possible combination of the previously disclosed embodiments/alternatives, taken as whole or in part, can be implemented and has to be considered within the inventive concept of the present disclosure. All the details may furthermore be replaced with technically equivalent elements and any of the previously described components may be differently shaped, or used in a different number or parts or elements, or the components previously described can be differently connected with respect to each other, provided they are suitable for the scope they are devised for; e.g. the parts 20 or 21 or subparts thereof may be differently shaped or positioned; for example the internal walls of the cavity defining the circuit for the refrigerant can be sandblasted, ribbed, rough, etc.

The invention claimed is:

1. A cooling apparatus for an electrical device, comprising an at least partially hollow body containing a refrigerant and having a plurality of electrically conductive sections, each of said plurality of electrically conductive sections having a respective coupling portion suitable to be thermally associated with a corresponding electrically conductive part of said electrical device, with each electrically conductive part being different from and separate from said electrically conductive sections, wherein said at least partially hollow body further comprises one or more electrically insulating sections, each of said one or more electrically insulating sections being positioned between and electrically insulating from each other two adjacent electrically conductive sections of said plurality of electrically conductive sections.

2. A cooling apparatus according to claim 1, wherein said at least partially hollow body is arranged so as said plurality of electrically conductive sections and said one or more electrically insulating sections are positioned in series to each other.

3. A cooling apparatus according to claim 1, wherein said at least partially hollow body is arranged so as at least two electrically conductive sections of said plurality of electrically conductive sections are positioned parallel to each other.

4. A cooling apparatus according to claim 1 wherein said at least partially hollow body comprises a conduit-shaped part comprising a plurality of separate parts assembled together or realized in a single piece.

5. A cooling apparatus according to claim 1 wherein said at least partially hollow body comprises a heat exchanger part connected at the ends of said conduit-shaped part.

6. A cooling apparatus according to claim 1, wherein said one or more electrically insulating sections are made of polymer resin.

7. A cooling apparatus according to claim 6, wherein said one or more electrically insulating sections made of polymer resin are molded over and between corresponding ends of two adjacent electrically conductive sections.

8. A cooling apparatus according to claim 1, wherein said one or more electrically insulating sections are made of ceramic material.

9. A cooling apparatus according to claim 1 wherein said plurality of electrically conductive sections are made of a material selected from the group consisting of aluminum, copper, steel or alloys comprising such materials.

10. A cooling apparatus according to claim 1 wherein said refrigerant is a dielectric refrigerant.

11. A cooling apparatus according claim 1 wherein said at least partially hollow body comprises one or more flexible portions.

12. A cooling apparatus according to claim 1 wherein said electrically conductive sections are tubular-shaped and wherein said one or more electrically insulating sections are made of epoxy resin molded over and between corresponding ends of two adjacent electrically conductive sections.

13. A cooling apparatus according to claim 12, wherein each of said tubular-shaped electrically conductive section has at least one end portion having an enlarged cross-section.

14. An electrical or electronic device wherein it comprises a cooling apparatus according claim 1.

15. A circuit breaker comprising a first series of side-by-side terminals and a second series of side-by-side terminals for connection of the circuit breaker with an electrical circuit, wherein it comprises at least one cooling apparatus according claim 1, and wherein said first and second side-by-side terminals are in thermal contact with corresponding said coupling portions.

16. An electrical switchboard wherein it comprises a cooling apparatus according claim 1.

17. A cooling apparatus according claim 1 in combination with the electrical device, the electrical device comprising a circuit breaker having terminals defining said electrically conductive parts, each said terminal being in thermal contact with a corresponding said coupling portion.

* * * * *